United States Patent

Marchant

(10) Patent No.: US 6,713,813 B2
(45) Date of Patent: Mar. 30, 2004

(54) FIELD EFFECT TRANSISTOR HAVING A LATERAL DEPLETION STRUCTURE

(75) Inventor: Bruce D. Marchant, Murray, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/774,780

(22) Filed: Jan. 30, 2001

(65) Prior Publication Data

US 2002/0100933 A1 Aug. 1, 2002

(51) Int. Cl.[7] .............................................. H01L 29/76
(52) U.S. Cl. ...................... 257/330; 257/229; 257/239; 257/292
(58) Field of Search ................................. 257/329, 330, 257/331, 339, 341, 342; 438/206, 212, 270, 271

(56) References Cited

U.S. PATENT DOCUMENTS

| | | |
|---|---|---|
| 4,579,621 A | 4/1986 | Hine |
| 4,638,344 A | 1/1987 | Cardwell, Jr. |
| 4,698,653 A | 10/1987 | Cardwell, Jr. |
| 4,754,310 A | 6/1988 | Coe |
| 5,072,266 A | 12/1991 | Bulucea et al. |
| 5,216,275 A | 6/1993 | Chen |
| 5,219,793 A | 6/1993 | Cooper et al. |
| 5,275,965 A | 1/1994 | Manning |
| 5,294,824 A | 3/1994 | Okada |
| 5,300,447 A | 4/1994 | Anderson |
| 5,326,711 A | 7/1994 | Malhi |
| 5,405,794 A | 4/1995 | Kim |
| 5,424,231 A | 6/1995 | Yang |
| 5,438,215 A | 8/1995 | Tihanyi |
| 5,473,180 A | 12/1995 | Ludikhuize |
| 5,581,100 A | 12/1996 | Ajit |
| 5,583,065 A | 12/1996 | Miwa |
| 5,592,005 A | 1/1997 | Floyd et al. |
| 5,656,843 A * | 8/1997 | Goodyear et al. .......... 257/329 |
| 5,780,343 A | 7/1998 | Bashir |
| 5,895,951 A * | 4/1999 | So et al. ...................... 257/329 |
| 5,972,741 A | 10/1999 | Kubo et al. |
| 5,973,360 A | 10/1999 | Tihanyi |
| 6,005,271 A | 12/1999 | Hshieh |
| 6,037,632 A | 3/2000 | Omura et al. |
| 6,040,600 A | 3/2000 | Uenishi et al. |

(List continued on next page.)

FOREIGN PATENT DOCUMENTS

| | | |
|---|---|---|
| CN | 1036666 A | 10/1989 |
| EP | 0975024 A2 | 1/2000 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |

(List continued on next page.)

OTHER PUBLICATIONS

Daisuke Ueda et al., "An Ultra–Low On–Resistance Power MOSFET Fabricated by Using a Fully Self–Aligned Process", IEEE Transactions on Electron Devices, Apr. 1987, pp. 926–930, vol. ED–34, No. 4.

(List continued on next page.)

*Primary Examiner*—David Nelms
*Assistant Examiner*—Dao H. Nguyen
(74) *Attorney, Agent, or Firm*—Townsend and Townsend and Crew LLP

(57) ABSTRACT

A field effect transistor device and a method for making a field effect transistor device are disclosed. The field effect transistor device includes a stripe trench extending from the major surface of a semiconductor substrate into the semiconductor substrate to a predetermined depth. The stripe trench contains a semiconductor material of the second conductivity type to form a PN junction at an interface formed with the semiconductor substrate.

15 Claims, 12 Drawing Sheets

U.S. PATENT DOCUMENTS

| | | | |
|---|---|---|---|
| 6,049,108 A | * 4/2000 | Williams et al. | 257/155 |
| 6,057,558 A | 5/2000 | Yamamoto et al. | |
| 6,066,878 A | 5/2000 | Neilson | |
| 6,081,009 A | 6/2000 | Neilson | |
| 6,084,264 A | * 7/2000 | Darwish | 257/329 |
| 6,084,268 A | 7/2000 | de Frésart et al. | |
| 6,097,063 A | 8/2000 | Fujihira | |
| 6,103,578 A | 8/2000 | Uenishi et al. | |
| 6,156,611 A | 12/2000 | Lan et al. | |
| 6,163,052 A | 12/2000 | Liu et al. | |
| 6,168,983 B1 | 1/2001 | Rumennik et al. | |
| 6,171,935 B1 | 1/2001 | Nance et al. | |
| 6,184,545 B1 | 2/2001 | Werner et al. | |
| 6,184,555 B1 | 2/2001 | Tihanyi et al. | |
| 6,188,105 B1 | * 2/2001 | Kocon et al. | 257/327 |
| 6,191,447 B1 | 2/2001 | Baliga | |
| 6,201,279 B1 | 3/2001 | Pfirsch | |
| 6,204,097 B1 | 3/2001 | Shen et al. | |
| 6,207,994 B1 | 3/2001 | Rumennik et al. | |
| 6,225,649 B1 | 5/2001 | Minato | |
| 6,239,464 B1 | 5/2001 | Tsuchitani et al. | |
| 6,271,562 B1 | 8/2001 | Deboy et al. | |
| 6,291,856 B1 | 9/2001 | Miyasaka et al. | |
| 6,294,818 B1 | 9/2001 | Fujihira | |
| 6,297,534 B1 | 10/2001 | Kawaguchi et al. | |
| 6,307,246 B1 | 10/2001 | Nitta et al. | |
| 6,309,920 B1 | 10/2001 | Laska et al. | |
| 6,313,482 B1 | 11/2001 | Baliga | |
| 6,326,656 B1 | 12/2001 | Tihanyi | |
| 6,337,499 B1 | 1/2002 | Werner | |
| 6,346,464 B1 | 2/2002 | Takeda et al. | |
| 6,346,469 B1 | 2/2002 | Greer | |
| 6,353,252 B1 | 3/2002 | Yasuhara et al. | |
| 6,362,112 B1 | 3/2002 | Hamerski | |
| 6,362,505 B1 | 3/2002 | Tihanyi | |
| 6,365,462 B2 | 4/2002 | Baliga | |
| 6,365,930 B1 | 4/2002 | Schillaci et al. | |
| 6,368,921 B1 | 4/2002 | Hijzen et al. | |
| 6,376,314 B1 | 4/2002 | Jerred | |
| 6,384,456 B1 | 5/2002 | Tihanyi | |
| 6,388,287 B2 | 5/2002 | Deboy et al. | |
| 6,400,003 B1 | 6/2002 | Huang | |
| 2001/0028083 A1 | 10/2001 | Onishi et al. | |
| 2001/0032998 A1 | 10/2001 | Iwamoto et al. | |
| 2001/0041400 A1 | 11/2001 | Ren et al. | |
| 2001/0050394 A1 | 12/2001 | Onishi et al. | |
| 2002/0009832 A1 | 1/2002 | Blanchard | |
| 2002/0014658 A1 | 2/2002 | Blanchard | |
| 2002/0066924 A1 | 6/2002 | Blanchard | |

FOREIGN PATENT DOCUMENTS

| | | |
|---|---|---|
| JP | 2001-015448 | 1/2001 |
| JP | 2001-015752 | 1/2001 |
| JP | 2001-111041 A | 2/2001 |
| JP | 2001-102577 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| WO | WO 00/33386 A2 | 6/2000 |
| WO | WO 00/68997 A1 | 11/2000 |
| WO | WO 00/68998 A1 | 11/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |

OTHER PUBLICATIONS

H.-R. Chang, et al., "Self-Aligned UMOSFET's with a Specific On-Resistance of 1 m$\Omega$cm$^2$", IEEE Transactions on Electron Devices, Nov. 1987, pp. 2329-2334, vol. ED-34, No. 11.

H. R. Chang, et al., "Numerical and Experimental Analysis of 500-V Power DMOSFET with an Atomic-Lattice Layout", 47th Annual Device Research Conference, Jun. 1989.

"IR develops CoolMOS™-equivalent technology, positions it at the top of a 3-tiered line of new products for SMPS", wysiwyg://79/http://www.irf.com/_FKK4aEd/whats-new/nr990403.ht, International Rectifier, Jul. 2000.

"CoolMOS™ C2 the second generation", Infineon.

* cited by examiner

US 6,713,813 B2

FIELD EFFECT TRANSISTOR HAVING A LATERAL DEPLETION STRUCTURE

FIELD OF THE INVENTION

Embodiments of the invention relate to field effect transistors such as MOSFET (metal oxide semiconductor field effect transistor) devices and methods for making field effect transistors.

BACKGROUND OF THE INVENTION

Power MOSFET devices are well known and are used in many applications. Exemplary applications include automotive electronics, portable electronics, power supplies, and telecommunications. One important electrical characteristic of a power MOSFET device is its drain-to-source on-state resistance ($R_{DS(on)}$), which is defined as the total resistance encountered by a drain current. $R_{DS(on)}$ is proportional to the amount of power consumed while the MOSFET device is on. In a vertical power MOSFET device, this total resistance is composed of several resistive components including an inversion channel resistance ("channel resistance"), a starting substrate resistance, an epitaxial portion resistance and other resistances. The epitaxial portion is typically in the form of a layer and may be referred to as an "epilayer". $R_{DS(on)}$ can be reduced in a MOSFET device by reducing the resistance of one or more of these MOSFET device components.

Reducing $R_{DS(on)}$ is desirable. For example, reducing $R_{DS(on)}$ for a MOSFET device reduces its power consumption and also cuts down on wasteful heat dissipation. The reduction of $R_{DS(on)}$ for a MOSFET device preferably takes place without detrimentally impacting other MOSFET characteristics such as the maximum breakdown voltage ($BV_{DSS}$) of the device. At the maximum breakdown voltage, a reverse-biased epilayer/well diode in a MOSFET breaks down resulting in significant and uncontrolled current flowing between the source and drain.

It is also desirable to maximize the breakdown voltage for a MOSFET device without increasing $R_{DS(on)}$. The breakdown voltage for a MOSFET device can be increased, for example, by increasing the resistivity of the epilayer or increasing the thickness of the epilayer. However, increasing the epilayer thickness or the epilayer resistivity undesirably increases $R_{DS(on)}$.

It would be desirable to provide for a MOSFET device with a high breakdown voltage and a low $R_{DS(on)}$. Embodiments of the invention address this and other problems.

SUMMARY OF THE INVENTION

Embodiments of the invention are directed to MOSFET devices and methods of manufacture. The MOSFET devices have a low $R_{DS(on)}$ and have a high breakdown voltage. For example, with the current state of the art, in embodiments of the invention, $R_{DS(on)}$ for an exemplary 200 V N-channel trench MOSFET can be reduced by 80% as compared to a conventional 200 V N-channel trench MOSFET while maintaining a high breakdown voltage.

One embodiment of the invention is directed to a field effect transistor device comprising: a semiconductor substrate of a first conductivity type having a major surface and a drain region; a well region of a second conductivity type formed in the semiconductor substrate; a source region of the first conductivity type formed in the well region; a trench gate electrode formed adjacent to the source region; and a stripe trench extending from the major surface of the semiconductor substrate into the semiconductor substrate to a predetermined depth. The stripe trench contains a semiconductor material of the second conductivity type to form a PN junction at an interface formed with the semiconductor substrate.

Another embodiment of the invention is directed to a method of forming a field effect transistor device comprising: forming a well region of a second conductivity type in a semiconductor substrate of a first conductivity type, the semiconductor substrate having a major surface and a drain region; forming a source region of the first conductivity type in the well region; forming a trench gate electrode adjacent to the source region; forming a stripe trench extending from the major surface of the semiconductor substrate into the semiconductor substrate to a predetermined depth; and depositing a semiconductor material of the second conductivity type within the stripe trench.

Yet another embodiment of the invention is directed to a method of forming a field effect transistor device comprising: a) forming a well region of a second conductivity type in a semiconductor substrate of a first conductivity type having a major surface and a drain region; b) forming a source region of the first conductivity type formed in the well region; c) forming a gate electrode adjacent to the source region; d) forming a stripe trench extending from the major surface of the semiconductor substrate into the semiconductor substrate to a predetermined depth; and e) depositing a semiconductor material of the second conductivity type within the stripe trench, wherein at least one of steps a), b), and c) occurs after step e).

These and other embodiments of the invention are described in greater detail below with reference to the appended drawings.

DESCRIPTION OF THE SPECIFIC EMBODIMENTS

The present inventor has found that the resistance of the epilayer in a MOSFET becomes an increasingly significant component of $R_{DS(on)}$ for increasing MOSFET voltage breakdown ratings. For example, computer simulations have indicated that for a 30 volt N-channel trench MOSFET device, the epilayer resistance is about 30% or more of the total specific $R_{DS(on)}$. In another example, for a 200 V N-channel trench MOSFET device, the epilayer resistance is about 75 to 90% of the total specific $R_{DS(on)}$. Thus, for higher voltage applications in particular, it would be desirable to reduce the resistance of the epilayer and thus reduce $R_{DS(on)}$ for a corresponding MOSFET device. The reduction of $R_{DS(on)}$ preferably takes place without degrading the breakdown voltage characteristics of the MOSFET device.

Many numerical examples are provided to illustrate embodiments of the invention. It is to be understood that numerical examples such as breakdown voltage, $R_{DS(on)}$, etc. are provided herein for illustrative purposes only. These and other numbers or values in the application may vary significantly or insignificantly depending upon the specific semiconductor fabrication process used and, in particular, with future advances in semiconductor processing.

Under normal operation, the maximum breakdown voltage ($BV_{DSS}$) of a trench or planar DMOSFET (double diffused metal oxide semiconductor field effect transistor) is obtained by forming a depletion region at a junction between the epilayer and a well region of opposite conductivity type as the epilayer. The depletion region is formed by applying a reverse bias voltage across the junction. At the breakdown voltage, the reverse-biased epilayer/well diode breaks down and significant current starts to flow. Current flows between the source and drain by an avalanche multiplication process while the gate and the source are shorted together.

Figure 1:
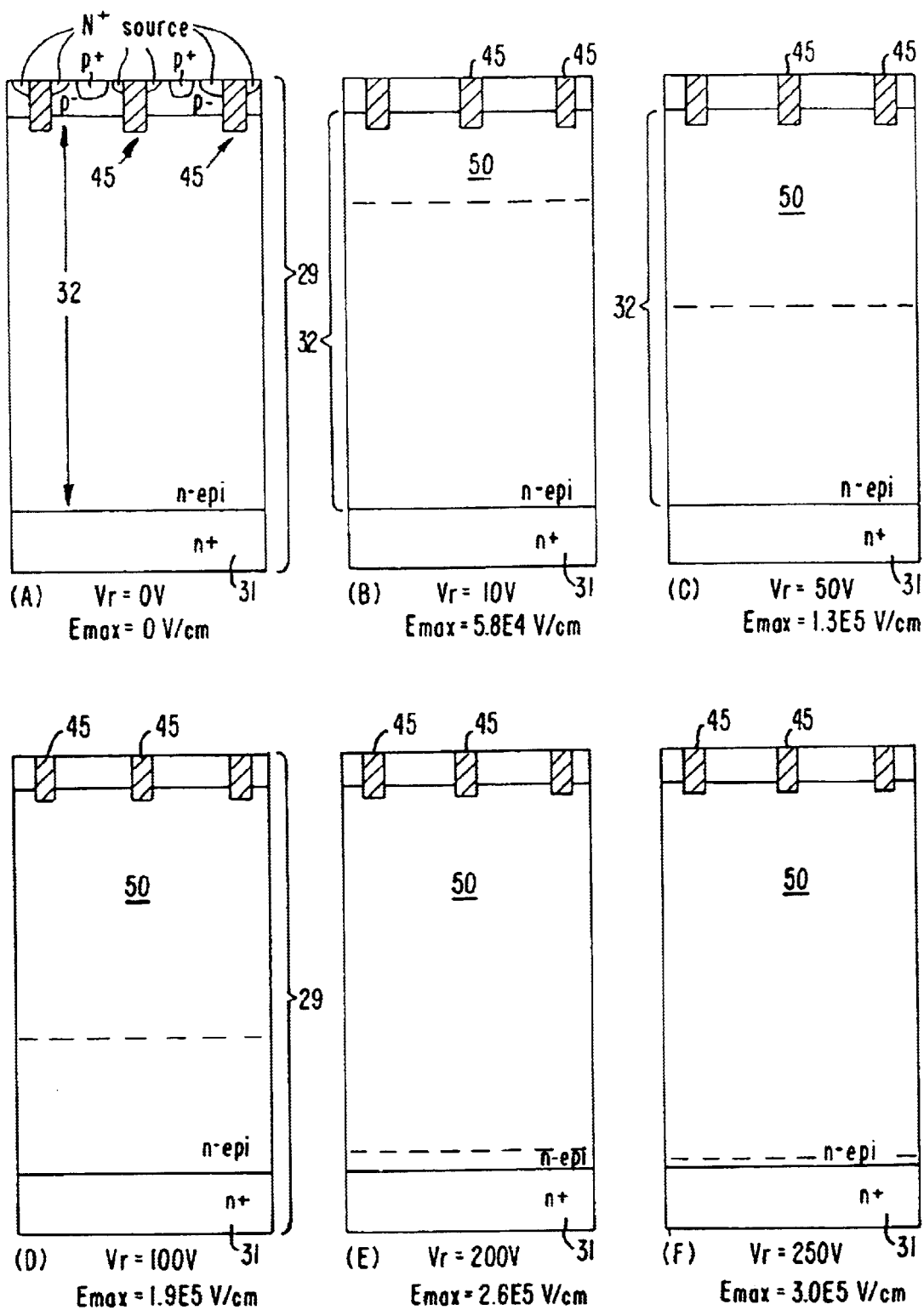
FIGS. 1(a) to 1(f) show schematic cross-sectional views of a conventional vertical trench MOSFET device. The figures show vertically expanding depletion regions as increasing reverse bias voltages are applied.

The formation of depletion regions in a conventional trench MOSFET device can be described with reference to FIGS. 1(a) to 1(f). These figures show schematic cross-sectional views of a conventional vertical trench MOSFET device. Each cross-section shows a plurality of gate structures 45 at a major surface of a semiconductor substrate 29. The semiconductor substrate 29 comprises an N–epilayer 32 and a drain region 31. In FIG. 1(a), N+source regions, P–wells, and P+body regions are shown. In order to clearly illustrate the horizontal depletion effect, N+source regions and P+body regions are not shown in FIGS. 1(b) to 1(f), 2(a) to 2(f), and 3(a) to 3(f).

In this example, the N–epilayer 32 has a resistivity of about 5.0 ohm-cm and an epilayer dopant concentration, $N_d$(epi), of about $1 \times 10^{15}$ cm$^{-3}$. The thickness of the N–epilayer 32 is about 20 microns. The device also has an "effective" epilayer thickness (sometimes referred to as "effective epi") of about 16.5 microns. The effective epilayer thickness is the thickness of the epilayer after taking into account any up diffusion of atoms from the N+drain region 31 and the formation of regions such as doped regions (e.g., P–wells) in the semiconductor substrate 29. For example, the effective epilayer thickness can be substantially equal to the distance between the bottom of a P+body or a P–well and the endpoint of any up-diffused donors in the N–epilayer 32 from the N+substrate 31. The effective epilayer for the device may also include the drift region for the device.

Each of the FIGS. 1(a) to 1(f) also shows the maximum electric field established ("$E_{max}$") as different reverse bias voltages are applied. As shown in the figures, as the reverse bias voltage is increased, $E_{max}$ also increases. If $E_{max}$ exceeds the critical electric field for a given dopant concentration, avalanche breakdown occurs. Consequently, $E_{max}$ is desirably less than the critical electric field.

FIGS. 1(a) to 1(f) respectively show how the depletion region 50 expands as increasing reverse bias voltages of 0V, 10V, 50V, 100V, 200V, and 250V are applied to the conventional trench MOSFET device. As shown in the figures, as greater reverse bias voltages are applied, the depletion region 50 spreads "vertically" in a direction from the P–well/epilayer interface to the N+drain region 31. This vertical growth of the depletion region forces the trade-off between lower $R_{DS(on)}$ and higher $BV_{DSS}$ in conventional trench MOSFET devices.

The present invention provides an improved MOSFET device wherein the depletion region initially spreads "horizontally" as higher reverse bias voltages are applied. In embodiments of the invention, a number of additional (and preferably deep) trenches are formed in the semiconductor substrate. These deep trenches are eventually used to form stripes that induce the formation of a horizontally spreading depletion region. The stripes comprise a material of the opposite type conductivity to the epilayer. For example, the stripes may comprise a P type material (e.g., a P, P+, or P–silicon) while the epilayer may comprise an N type material. Individual stripes may be present between adjacent gate structures and can extend from the major surface of the semiconductor substrate and into the epilayer. The stripes can also extend any suitable distance into the epilayer. For example, in some embodiments, the stripes extend all the way to the epilayer/drain region interface. The presence of the stripes allows the use of a lower resistance epilayer without exceeding the critical electric field. As will be explained in greater detail below, $R_{DS(on)}$ can be reduced without detrimentally affecting other MOSFET device characteristics such as the breakdown voltage.

FIGS. 2(a) to 2(f) illustrate an embodiment of the invention. These figures illustrate how a depletion region spreads as greater reverse bias voltages are applied. The gate bias voltages applied in the examples shown in FIGS. 2(a) to 2(f) are 0V, 1V, 2V, 10V, 200V, and 250V. Like the conventional trench MOSFET device shown in FIGS. 1(a) to 1(f), each of the cross-sections of FIGS. 2(a) to 2(f) include a plurality of trench gate structures 45 and a N–epilayer 32. The N–epilayer 32 is present in a semiconductor substrate 29.

Figure 2:
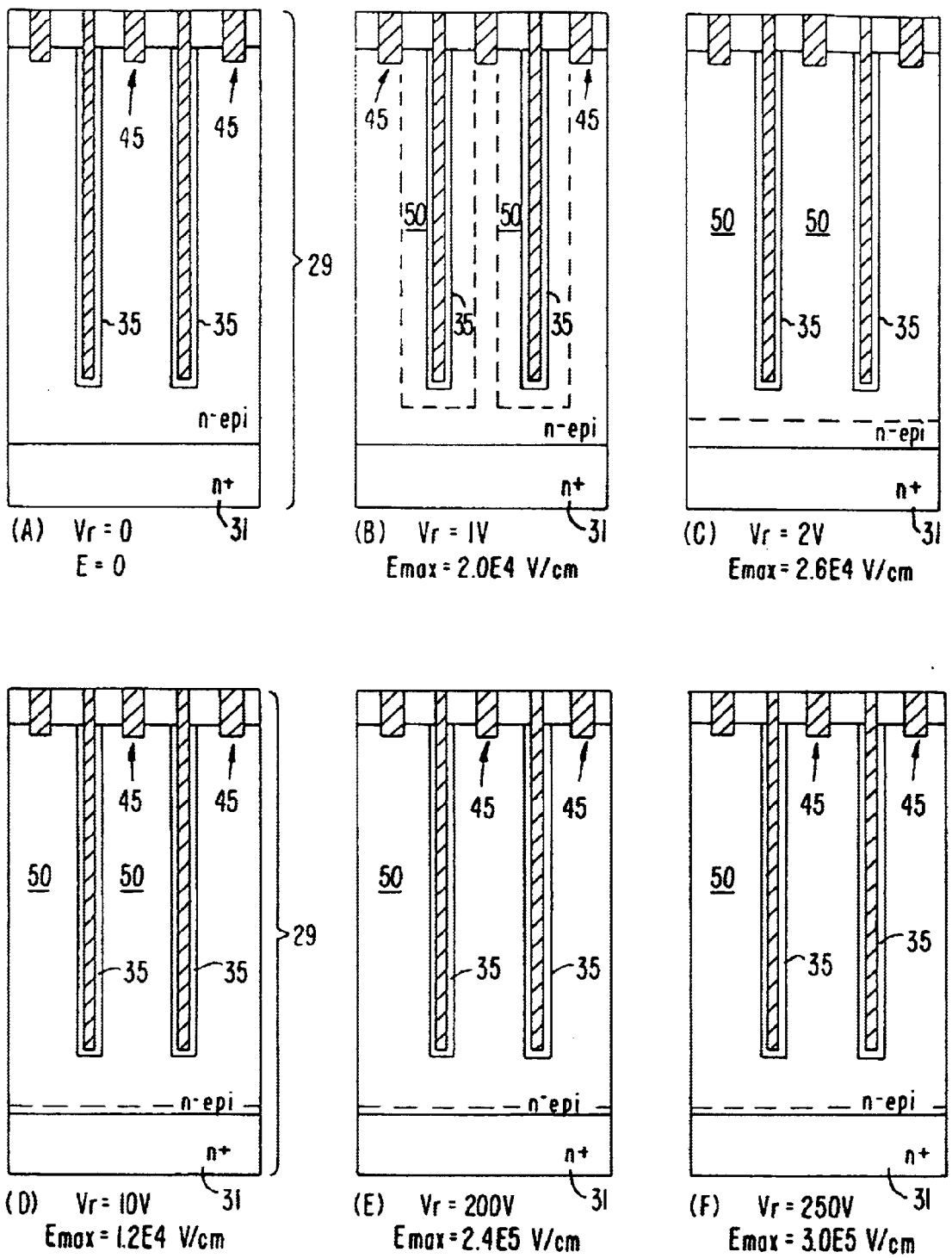
FIGS. 2(a) to 2(f) show schematic cross-sectional views of a vertical trench MOSFET device according to an embodiment of the invention. The figures show horizontally expanding depletion regions as increasing reverse bias voltages are applied.
Figure 3:
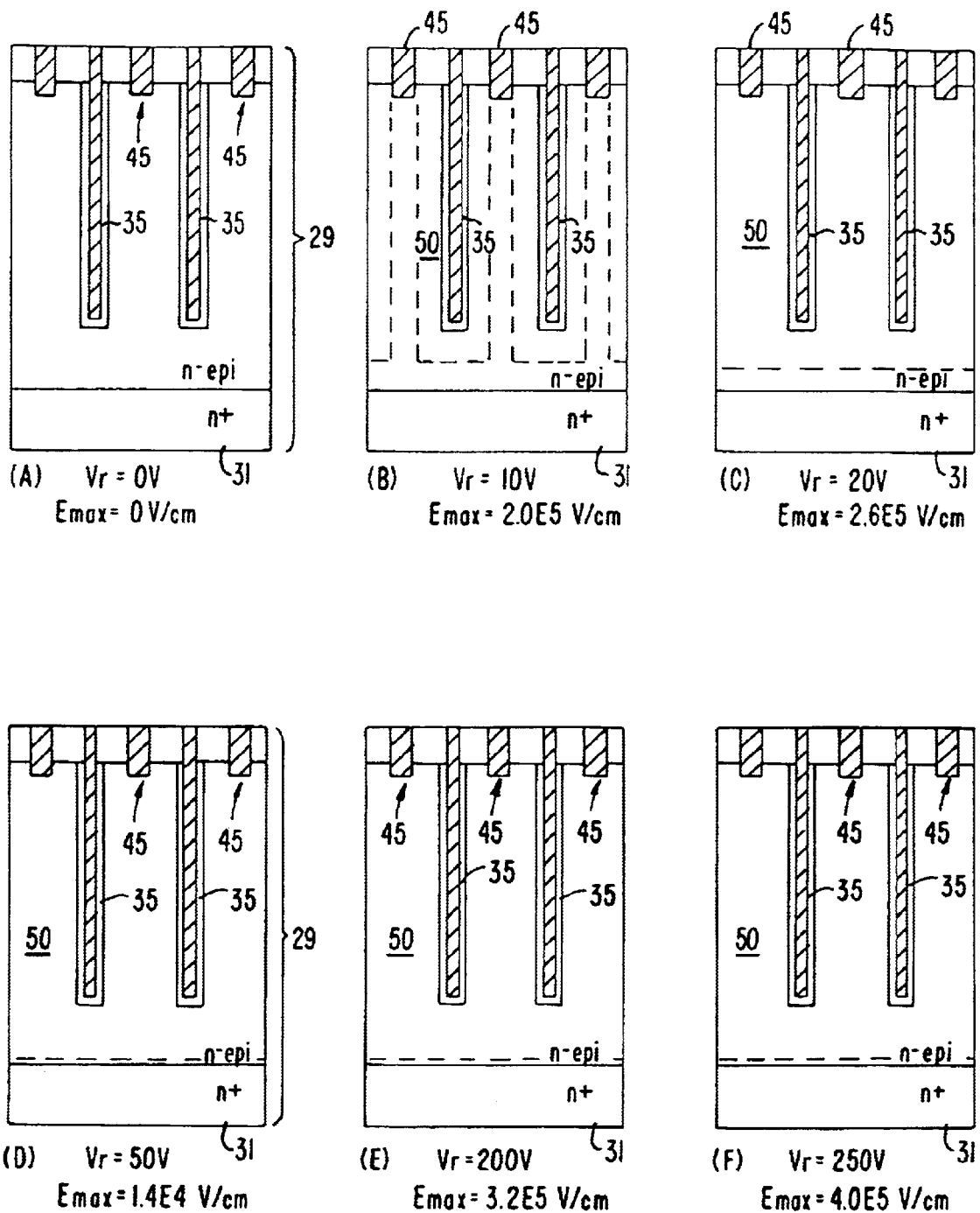
FIGS. 3(a) to 3(f) show schematic cross sectional views of a vertical trench MOSFET device according to an embodiment of the invention. The figures show horizontally expanding depletion regions as increasing reverse bias voltages are applied.

However, in FIGS. 2(a) to 2(f), a plurality of trenches forming stripes 35 (e.g., P stripes) of the opposite conductivity type as the N–epilayer 32 are respectively disposed between adjacent gate structures 45. In this example, the stripes 35 comprise a P type material. As shown in FIGS. 2(a) to 2(c), as greater reverse bias voltages are applied, the depletion region 50 initially spreads "horizontally" away from the sides of the stripes 35. The regions between adjacent stripes 35 are quickly depleted of charge carriers as the depletion region 32 expands from the side-surfaces of adjacent stripes 35. After the regions between adjacent stripes 35 are depleted of charge carriers, the depletion region 50 spreads vertically in a direction from the ends of the stripes 35 towards the N+drain region 31. The epilayer 32 in the embodiment is depleted of charge carriers much more quickly than when depletion initially occurs in a "vertical" manner (e.g., as shown in FIGS. 1(a) to 1(f)). As illustrated in FIG. 2(c) (reverse bias voltage=2V) and FIG. 1(e) (reverse bias voltage=200 V), the depletion region 50 is similar in area with significantly less applied voltage (2V compared to 200 V).

FIGS. 3(a) to 3(f) show cross sections of another MOSFET device according to another embodiment of the invention. In these figures, like elements are denoted by like numerals in prior figures. However, unlike the MOSFET devices described in prior figures, the epilayer 50 in the MOSFET device shown in FIGS. 3(a) to 3(f) has a resistivity of about 0.6 ohm-cm, a dopant concentration ($N_d$) of about $1 \times 10^{16}$ cm$^3$, a thickness of about 16 microns, and an effective epilayer thickness of about 12.5 microns.

FIGS. 3(a) to 3(f) respectively show how the depletion region 50 changes at reverse bias voltages of 0V, 10V, 50V, 100V, 200V, and 250V. Like the MOSFET device embodiment shown in FIGS. 2(a) to 2(f), the depletion region 50 initially spreads "horizontally" as higher reverse bias voltages are applied. Also, in this example, the maximum electric field ($E_{max}$) at each of these applied reverse bias voltages does not exceed the critical field for avalanche breakdown for the stated dopant concentration. Consequently, a high breakdown voltage (e.g., 250 V) can be obtained while using a thinner and lower resistivity. The thinner and lower resistivity epilayer advantageously results in a lower resistance epilayer and thus, a reduced $R_{DS(on)}$ value. The dimensions and doping level in the stripes 35 are adjusted to balance the total charge in the stripes with the total charge in the epilayer depletion region 50.

Figure 4:
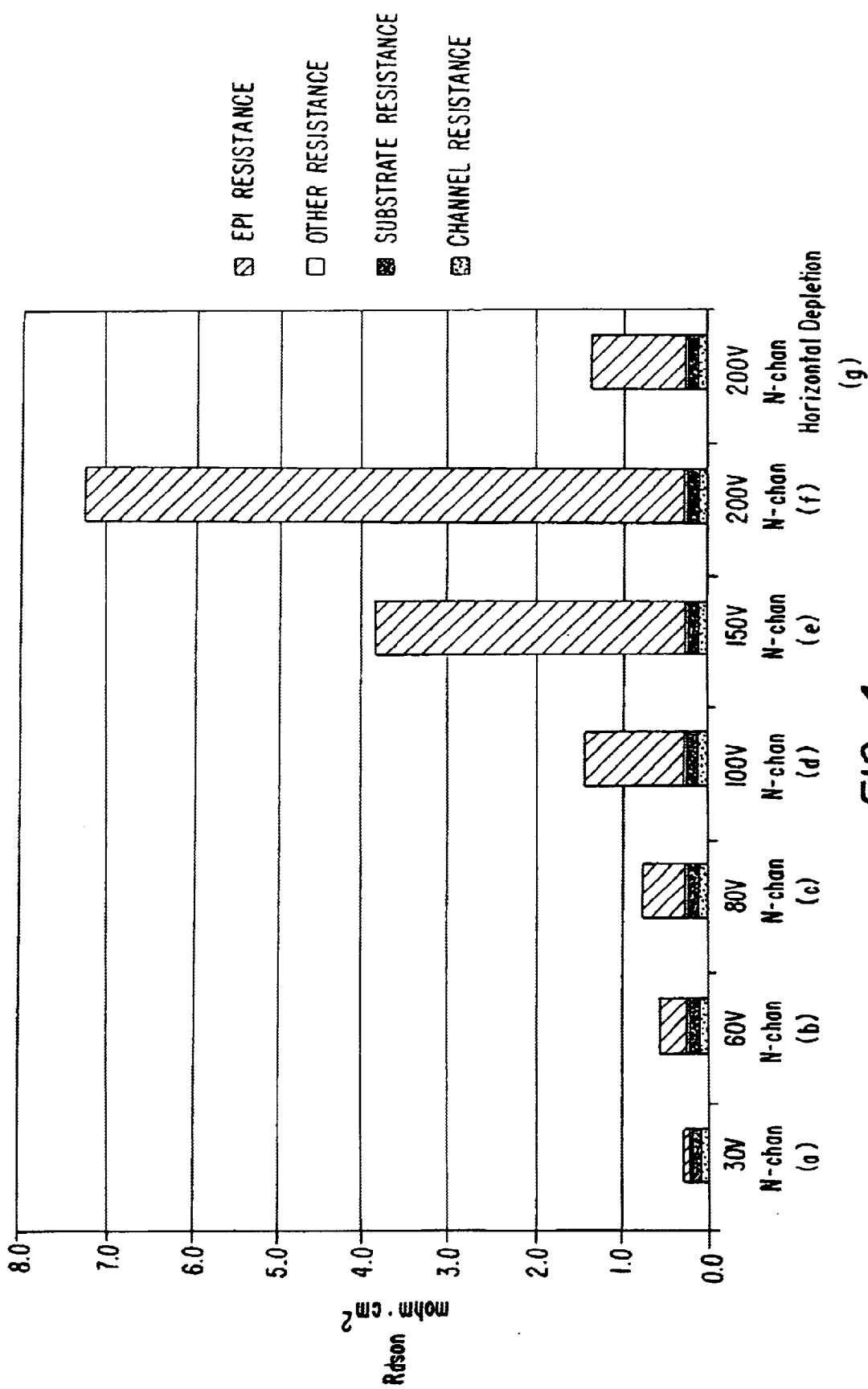
FIG. 4 is a bar graph illustrating the various resistive components making up $R_{DS(on)}$ in various MOSFET devices with different breakdown voltage ratings.

As noted above, as the breakdown voltage ratings for MOSFET devices increase, the epilayer resistance becomes a significantly increasing component of the total specific $R_{DS(on)}$. For example, FIG. 4 shows a bar graph illustrating some components of $R_{DS(on)}$ for a number of N-channel MOSFET devices with different breakdown voltage ratings. Bar (a) represents the $R_{DS(on)}$ for a control N-channel 30 V MOSFET device at 500 A. Bars (b) to (f) refer to conventional trench N-channel MOSFET devices with respective breakdown voltages of 60, 80, 100, 150, and 200 V. As is clearly evident in FIG. 4, as the breakdown voltage increases, the epilayer resistance has a greater impact on $R_{DS(on)}$. For example, in the conventional 200 V N-channel MOSFET device example, the epilayer resistance constitutes over 90% of the total specific $R_{DS(on)}$. In contrast, in the 30 V N-channel MOSFET example, the epilayer resistance has a significantly lower impact on $R_{DS(on)}$.

In embodiments of the invention, the epilayer resistance can be lowered by incorporating trenched stripes in the epilayer. This reduces $R_{DS(on)}$ as compared to a similar conventional MOSFET device with a similar breakdown voltage rating. For example, bar (g) in FIG. 4 shows the improvement provided for a trench MOSFET device according to an exemplary embodiment of the invention. As shown, the epilayer resistance can be significantly reduced when using trenched stripes having the opposite conductivity of the epilayer in a MOSFET device. As shown at bar (g), the total specific $R_{DS(on)}$ for a 200 V trench N-channel MOSFET device is less than 1.4 milliohm-cm$^2$. In contrast, for a conventional 200 V N-channel trench MOSFET without the stripes of the opposite conductivity, the total specific $R_{DS(on)}$ is about 7.5 milliohm-cm$^2$. Accordingly, these exemplary embodiments of the invention can exhibit a greater than 5-fold reduction in $R_{DS(on)}$ than conventional trench MOSFET devices.

FIGS. 5 to 11 show graphs of reverse IV curves for MOSFET devices according to embodiments of the invention.

Figure 5:
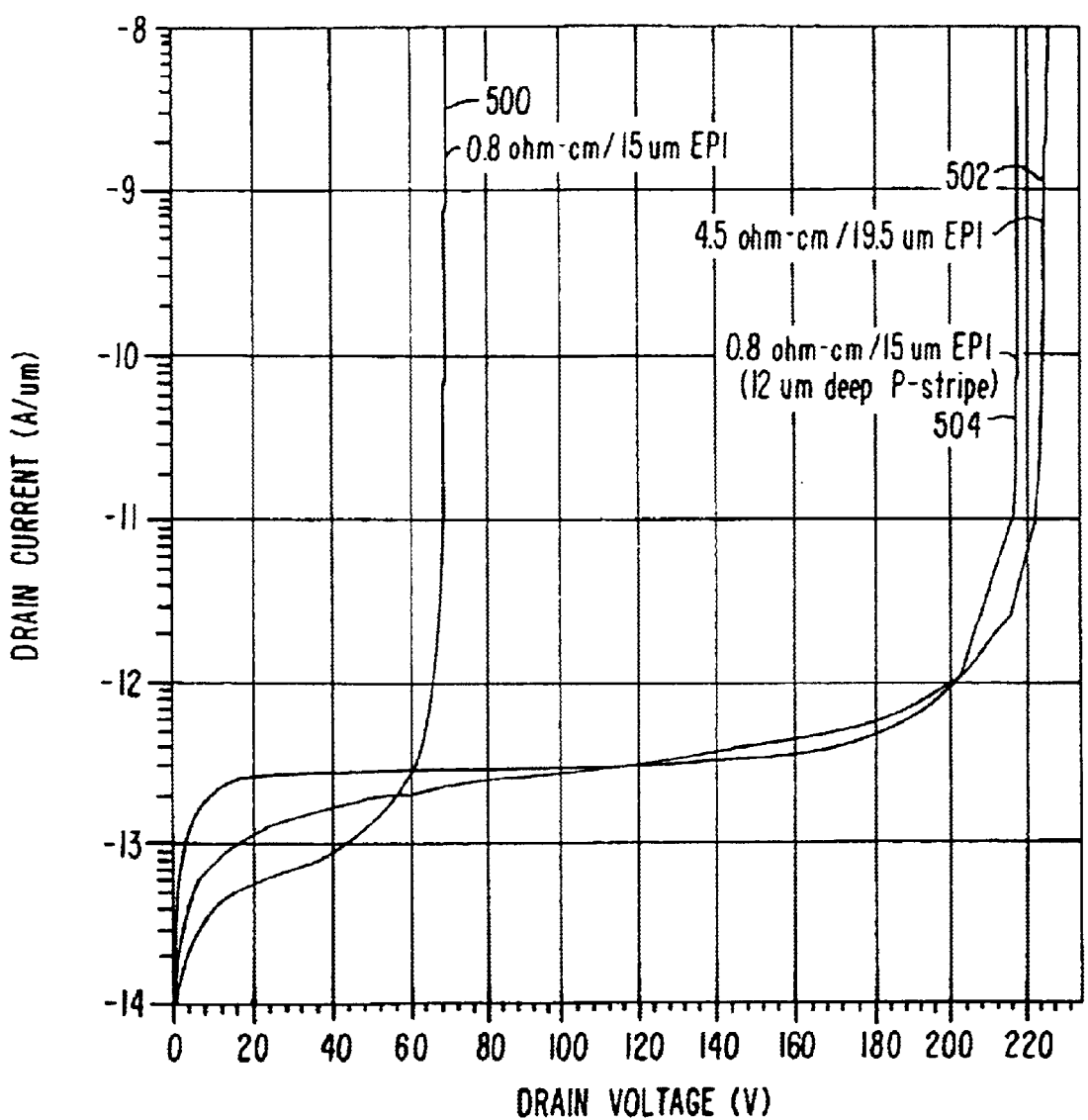
FIG. 5 is a graph comparing reverse IV curves for conventional trench MOSFET devices with a reverse IV curve for a trench MOSFET device according to an embodiment of the invention.

FIG. 5 is a graph showing reverse IV curves for conventional trench MOSFET devices and a MOSFET device according to an embodiment of the invention. FIG. 5 shows IV curves 500, 502 for two MOSFET devices without P-stripes. The first curve 500 is for a MOSFET device with an epilayer resistance of 0.8 milliohm-cm and an epilayer thickness of 15 microns. The second curve 502 is for a MOSFET device with an epilayer resistivity of 4.6 milliohm-cm and an epilayer thickness of 19.5 microns. As expected, the MOSFET device with the thicker epilayer and higher resistance has a higher breakdown voltage.

An IV curve 504 for an embodiment of the invention is also shown in FIG. 5. This exemplary embodiment has an epilayer resistance of about 0.8 ohm-cm, an epilayer thickness of about 15 microns and a P-stripe about 12 microns deep. As shown by the IV curve 504, this device embodiment has a relatively thin epilayer and a relatively low epilayer resistivity (and therefore a low $R_{DS(on)}$). It also has a breakdown voltage approaching 220 V. The breakdown voltage is comparable to the breakdown voltage exhibited by a conventional MOSFET device having a thicker and more resistive epilayer.

Figure 6:
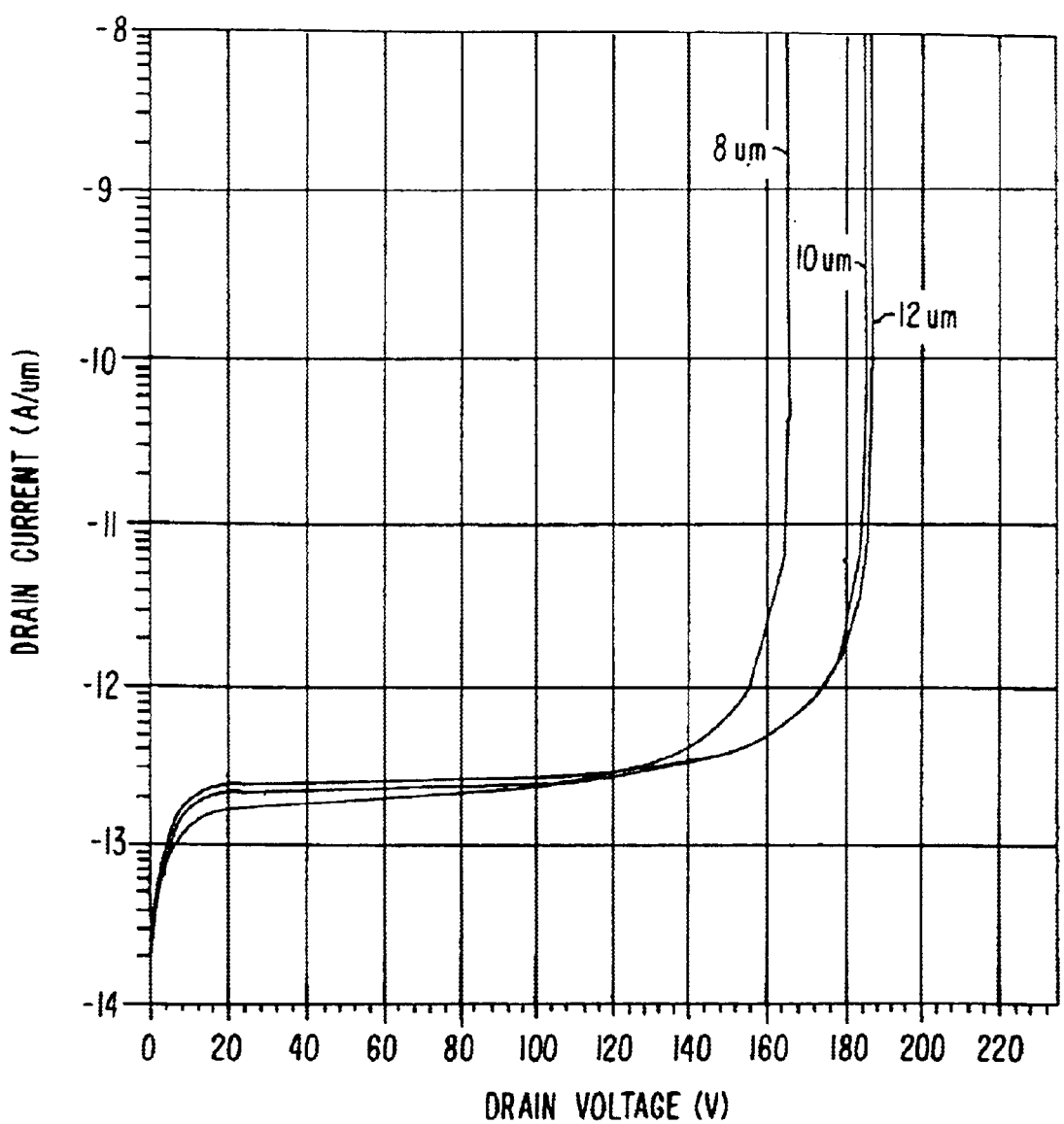
FIG. 6 is a graph showing reverse IV curves for trench MOSFET devices with different P-stripe depths. The curves show the effect of varying P-stripe depths on $BV_{DSS}$.

FIG. 6 shows reverse IV curves for MOSFET devices according to embodiments of the invention. The curves show the effect of varying the P-stripe depth on $BV_{DSS}$. In these devices, the epilayer has a resistance of about 0.8 ohm-cm and a thickness of about 13 microns. The P-stripe width is about 1.0 microns. The dopant concentration in the P-stripe is about $2.2 \times 10^{16}$ cm$^{-3}$. The P-stripe depth was varied at about 8, 10, and 12, microns. The IV curves for these variations show that the breakdown voltage increases as the depth of the P-stripes is increased.

Figure 7:
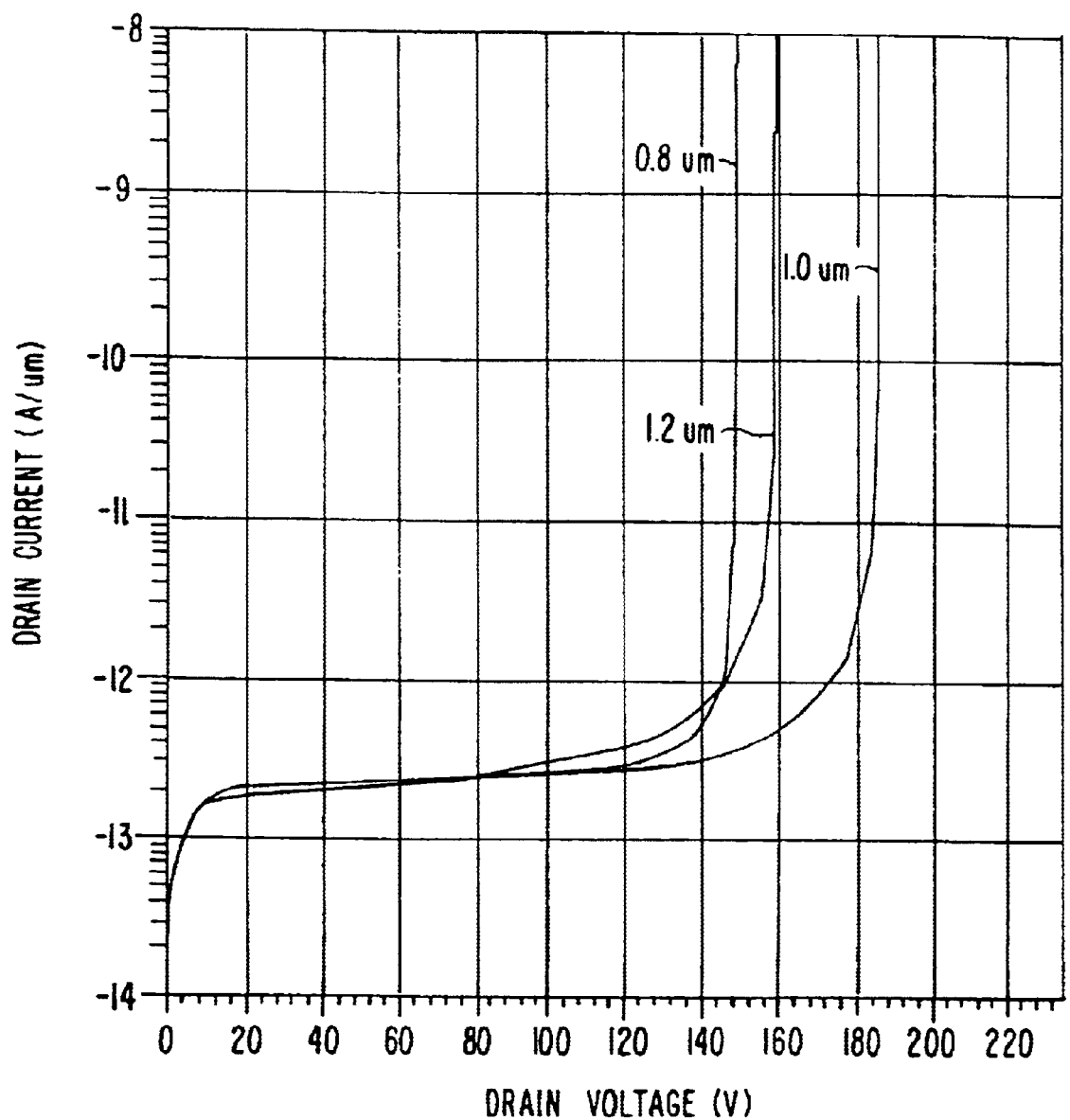
FIG. 7 is a graph showing reverse IV curves for trench MOSFET devices with different P-stripe widths. The curves show the effect of varying P-stripe widths on $BV_{DSS}$.

FIG. 7 shows reverse IV curves for MOSFET devices according to embodiments of the invention. The curves show the effect of P-stripe width variations on $BV_{DSS}$. In this example, the devices have an epilayer resistance of about 0.8 ohm-cm and a thickness of about 13 microns. The P-stripe depth is about 10 microns, and the dopant concentration in the P-stripe is about $2.2 \times 10^{16}$ cm$^{-3}$. IV curves for P-stripes with widths of about 0.8, 1.0, and 1.2 microns are shown. The IV curves show that the breakdown voltage is higher when the width of the P-stripes is equal to 1 micron.

Embodiments of the present invention can be applied to both trench and planar MOSFET technologies. However, trench MOSFET devices are preferred as they advantageously occupy less space than planar MOSFET devices. In either case, the breakdown voltage of the device may be from about 100 to about 400 volts in some embodiments. For illustrative purposes, a method of manufacturing a MOSFET device according to the present invention is described below in the context of a trenched gate process.

Figure 8A:
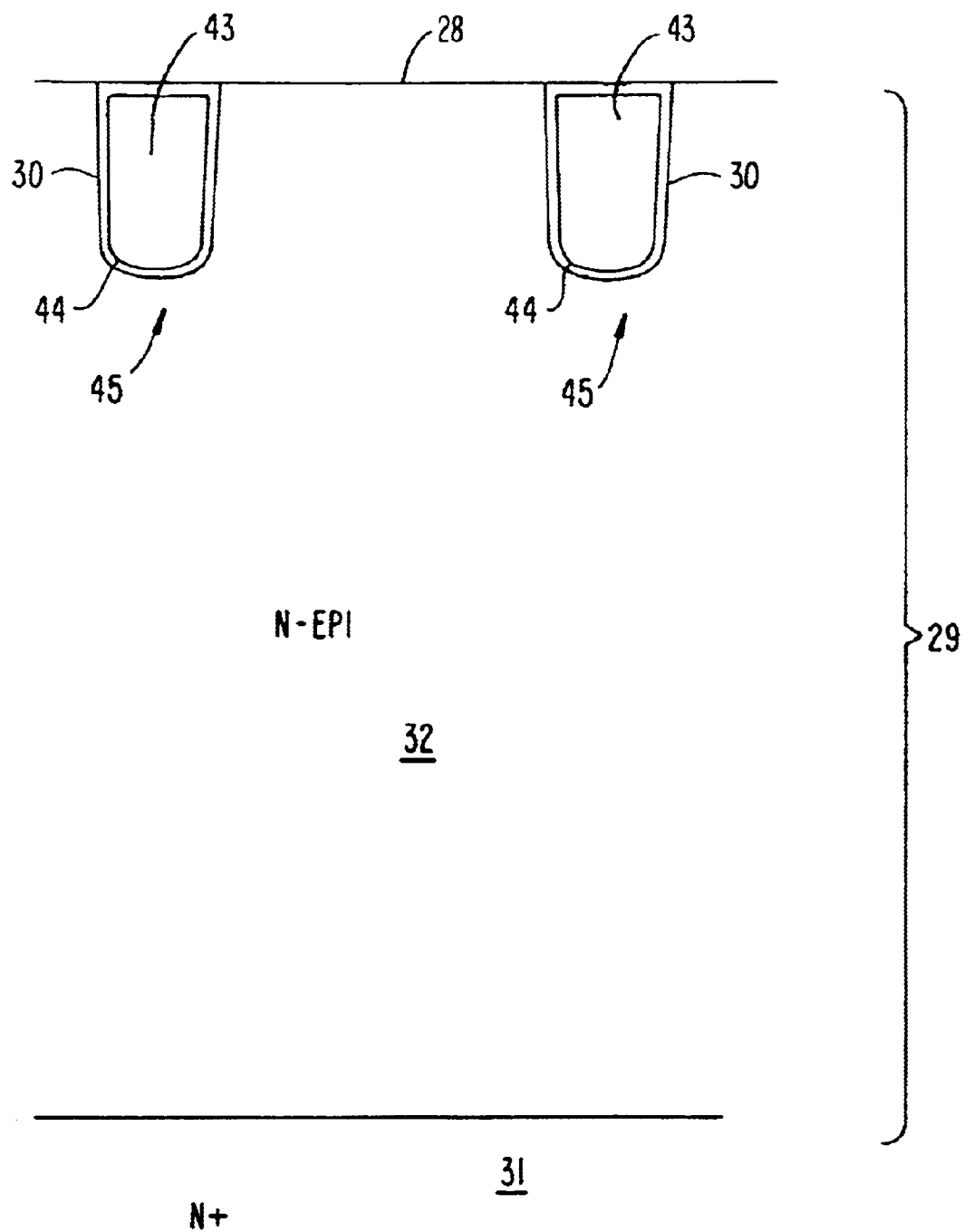
FIGS. 8(a) to 8(d) are cross-sectional views illustrating a method for forming a MOSFET device according to an embodiment of the invention.
Figure 8B:
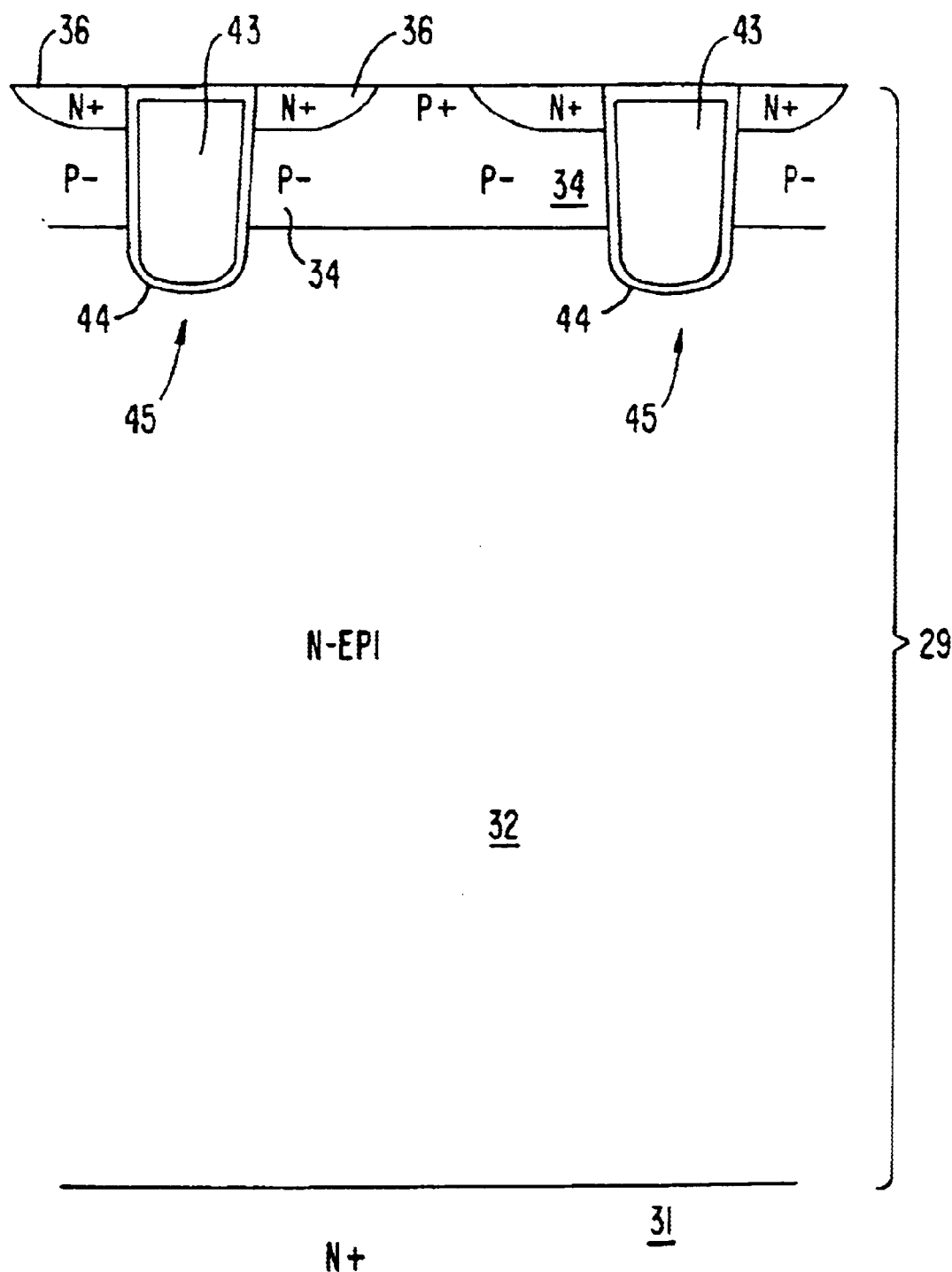
Figure 8C:
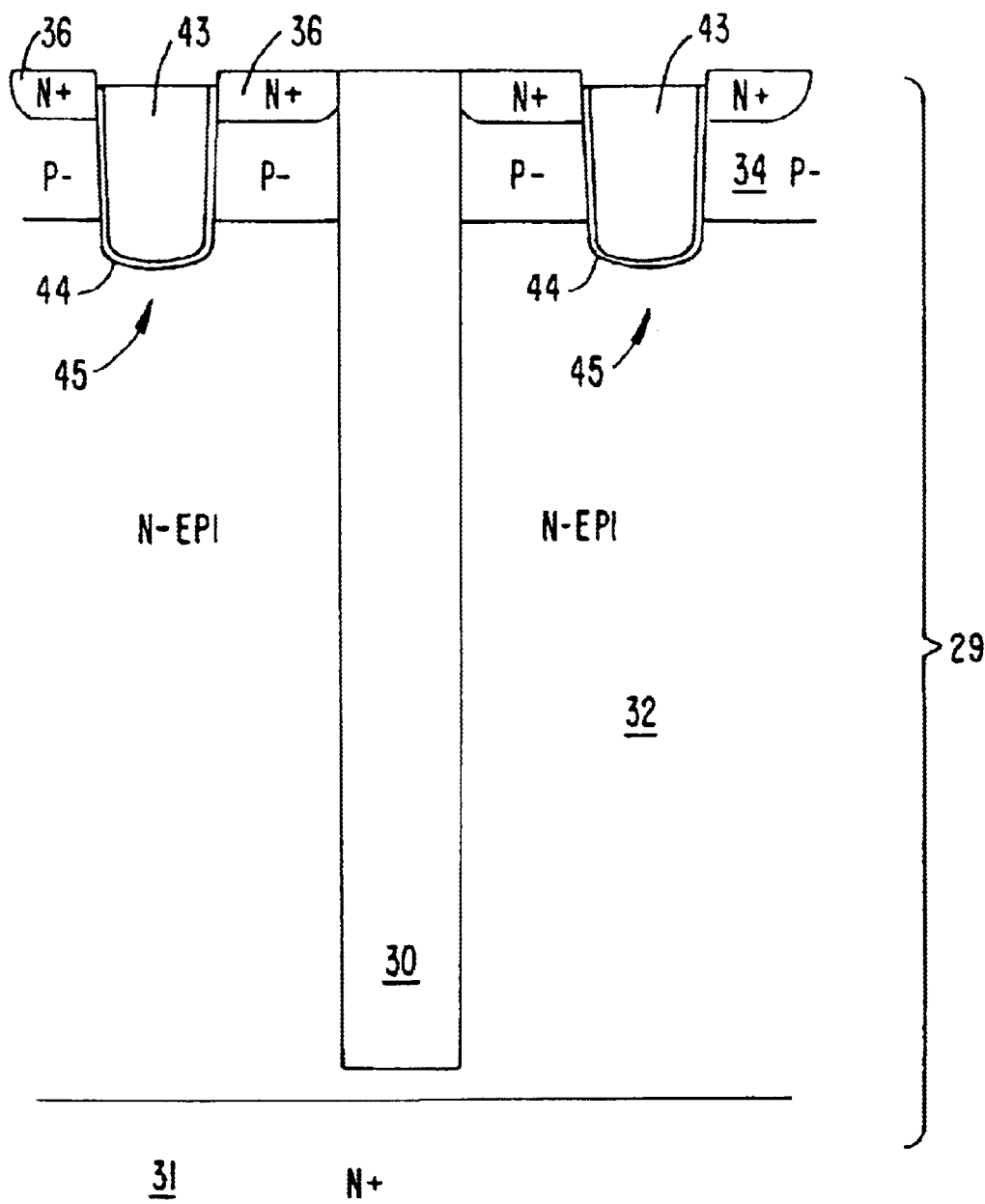
Figure 8D:
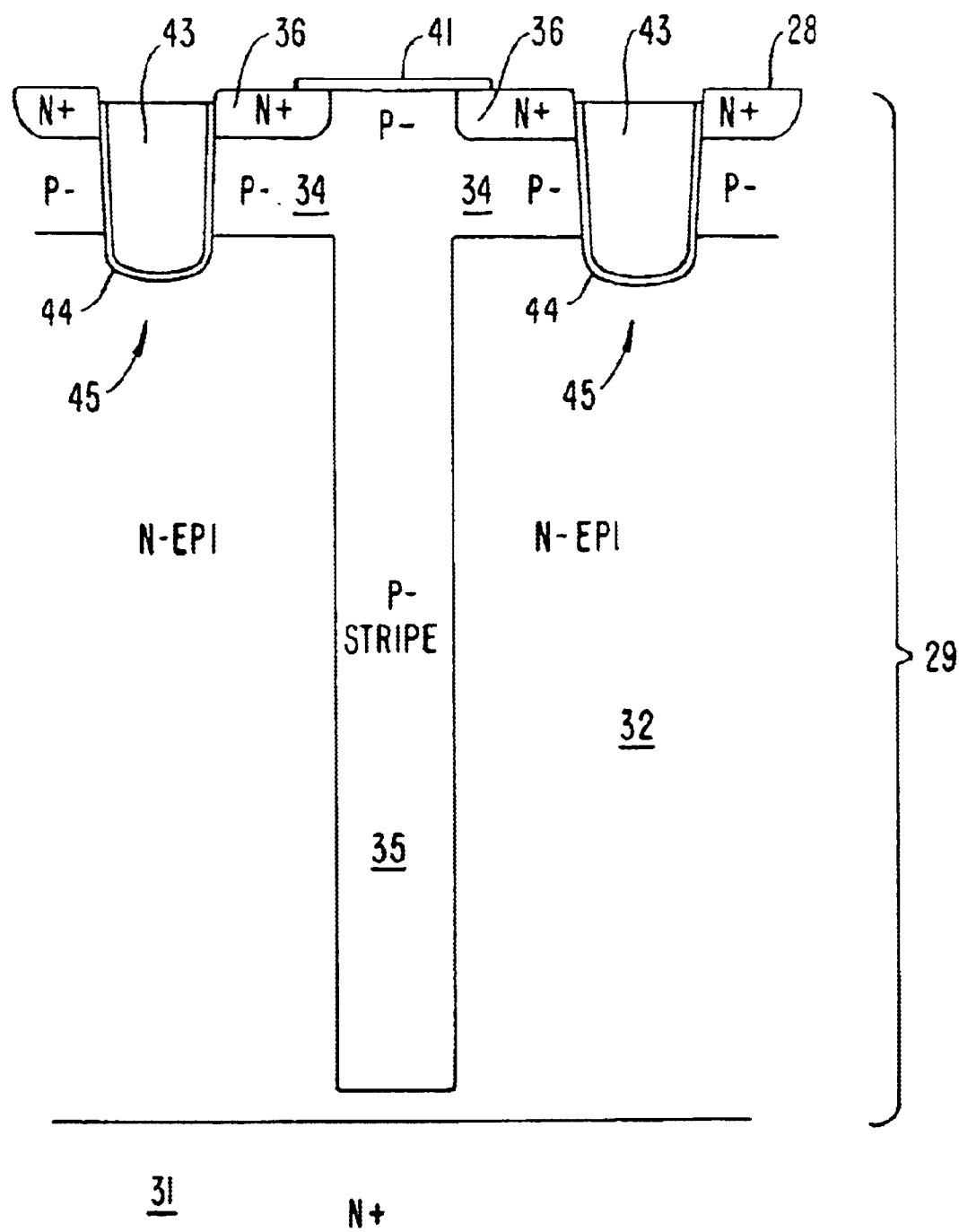

A detailed drawing of a power trench MOSFET device according to an embodiment of the invention is shown in FIG. 8(d). The power trench MOSFET device comprises a semiconductor substrate 29 having a drain region 31 and an N-epitaxial portion 32 proximate the drain region 31. The semiconductor substrate 29 may comprise any suitable semiconductor material including Si, GaAs, etc. The drift region for the MOSFET device may be present in the epitaxial portion 32 of the semiconductor substrate 29. A plurality of gate structures 45 are proximate the major surface 28 of the semiconductor substrate 29, and each gate structure 45 comprises a gate electrode 43 and a dielectric layer 44 on the gate electrode 43. A plurality of N+source regions 36 are formed in the semiconductor substrate 29. Each N+source region 36 is adjacent to one of the gate structures 45 and is formed in a plurality of P-well regions 34, which are also formed in the semiconductor substrate 29. Each P-well region 34 is disposed adjacent to one of the gate structures 45. A contact 41 for the source regions 36 is present on the major surface 28 of the semiconductor substrate 29. The contact 41 may comprise a metal such as aluminum. For purposes of clarity, other components which may be present in a MOSFET device (e.g., a passivation layer) may not be shown in FIG. 8(d).

In FIG. 8(d), a trenched P-stripe 35 is present in the semiconductor substrate 29. A plurality of P-stripes 35 may be respectively disposed between adjacent gate structures 45 when the gate structures 45 form an array of gate structures 45. The P-stripe 35 shown in FIG. 8(d) is disposed between adjacent gate structures 45. As shown, the P-stripe 35 shown in the figure is generally vertical and is oriented generally perpendicular to the orientation of the semiconductor substrate 29. The P-stripe 35 extends past the gate structures 45 and may penetrate most of the N-epitaxial portion 32. The N-epitaxial portion 32 in this embodiment surrounds the bottom and sides of the P-stripe 35. The dopant concentration at the sides and below the P-stripe 35 may be similar in this embodiment. Preferably, the P-stripe 35 has generally parallel sidewalls and a generally flat bottom. If the sidewalls are generally parallel, thin P-stripes 35 can be present between adjacent gate structures 45. The pitch between gate structures 45 can be minimized consequently resulting in MOSFET arrays of reduced size. In exemplary embodiments of the invention, the gate structure 45 (or gate electrode) pitch may be less than about 10 microns (e.g., between about 4 to about 6 microns). The width of the P-stripes 35 may be less than about 2 or 3 microns (e.g., between about 1 and about 2 microns).

Figure 8E:
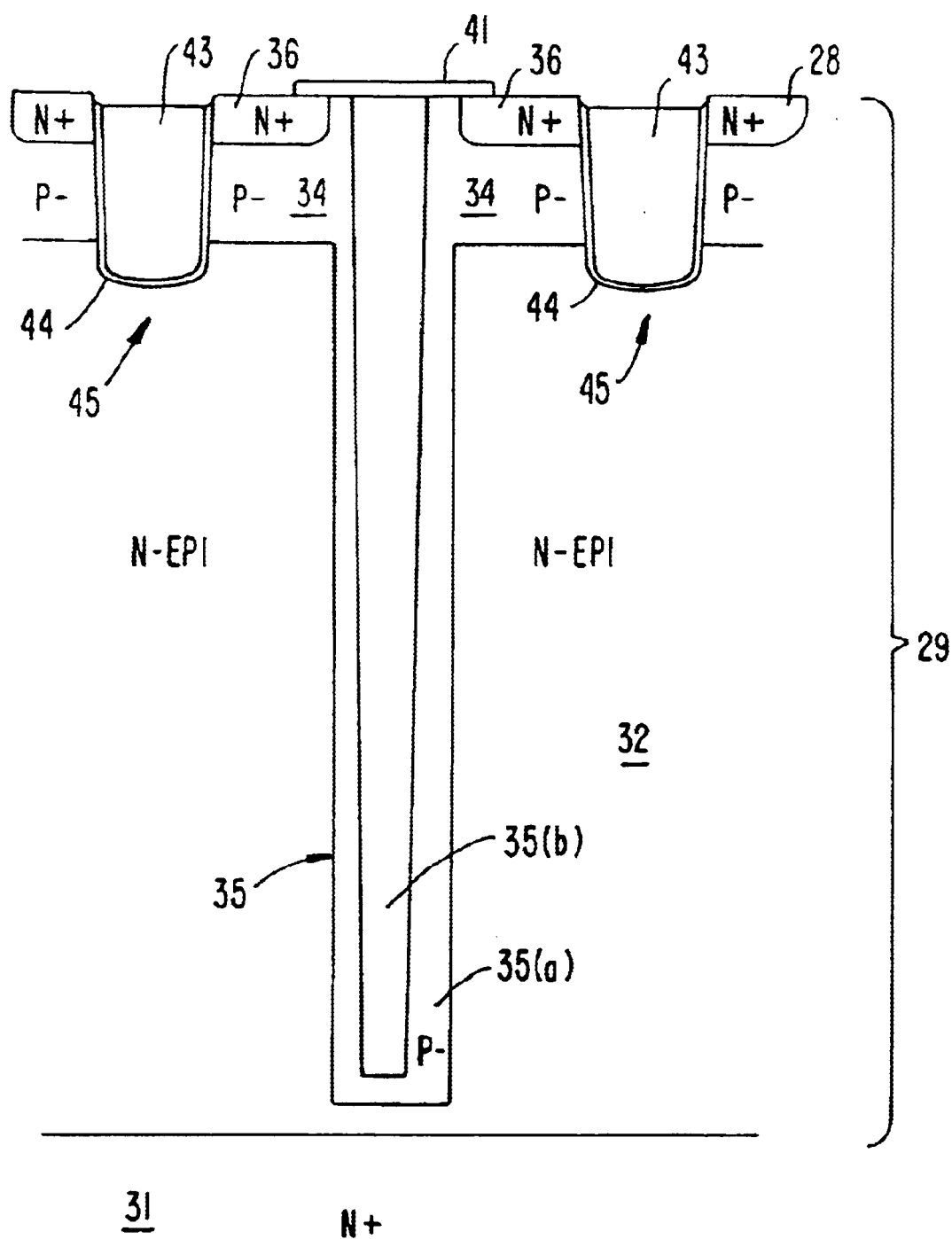
FIG. 8(e) shows a cross-sectional view of a MOSFET device with a stripe having a P–lining and a dielectric inner portion.

The stripe trenches in embodiments of the invention are filled or lined with a material of the opposite doping to the epitaxial portion in the semiconductor substrate. An embodiment of this type is shown in FIG. 8(e) and is described in greater detail below. If the stripe is lined with a material of the opposite conductivity type as the epitaxial portion, the stripe may comprise an inner dielectric portion and an outer semiconductor layer of the opposite conductivity type as the epitaxial portion. For example, the inner dielectric portion may comprise silicon oxide or air while the outer semiconductor layer may comprise P or N type epitaxial silicon.

The presence of the doped stripes may also be used as a heavy body to improve the ruggedness of the formed device. For example, like the presence of a P type heavy body in the epilayer, the presence of P-stripes penetrating the epilayer is believed to stabilize voltage variations in the device, thus increasing the device's reliability.

Suitable methods for forming the inventive power trench MOSFET devices can be described with reference to FIGS. 8(a) to 8(d).

With reference to FIG. 8(a), a structure including a semiconductor substrate 29 is provided. The semiconductor substrate 29 may comprise an N+drain region 31 and an N-epitaxial portion 32. Gate trenches 30 are formed proximate a major surface 28 of the semiconductor substrate 29. These gate trenches 30 may be formed by using, for example, anisotropic etching methods well known in the art. After the gate trenches 30 are formed, gate structures 45 are formed within the gate trenches 30 using methods well known in the art. Each gate structure 45 comprises a dielectric layer 44 and a gate electrode 43. The gate electrode 43 may comprise polysilicon and the dielectric layer 44 may comprise silicon dioxide.

Source regions, well regions, and other structures may also be formed in the semiconductor substrate 29 after or before forming the gate structures 45. With reference to FIG. 8(b), P-well regions 34 are formed in the semiconductor substrate 29 and then N+source regions 36 are formed in the semiconductor substrate 29. Conventional ion implantation or conventional diffusion processes may be used to form these regions. In this example, these doped regions are formed after the formation of the gate structures 45.

Additional details regarding the formation of well regions, gate structures, source regions, and heavy bodies are present in U.S. patent application Ser. No. 08/970,221 entitled "Field Effect Transistor and Method of Its Manufacture", by Brian Sze-Ki Mo, Duc Chau, Steven Sapp, Izak Bencuya, and Dean Edward Probst. This application is assigned to the same assignee as the assignee of the present application and the application is herein incorporated by reference in its entirety for all purposes.

In preferred embodiments, after the source regions, well regions, and/or gate structures are formed, one or more stripe trenches 30 are formed in the semiconductor substrate 29. For example, after the P-well regions 34, the N+source regions 36, and the gate structures 45 are formed, the stripe trench 30 shown in FIG. 8(c) may be formed, e.g., by an anisotropic etching process. The formed stripe trench 30 extends from the major surface 28 of the semiconductor substrate 29. It may extend any suitable distance past the gate structures 45 to the interface between the epitaxial portion 32 and the drain region 31. Preferably, the stripe trench 30 (and also the stripe material disposed therein) terminates at a depth which is between half the thickness of the N-epitaxial portion 32 and the full thickness of the epitaxial portion 32. For example, the stripe trench 30 may extend to the interface between the epitaxial portion 32 and the drain region 31.

After the stripe trench 30 is formed, as shown in FIG. 8(d), a stripe 35 is formed in the stripe trench 30. The stripe 35 comprises a material of the second conductivity type. In embodiments of the invention, the material of the second conductivity type is an epitaxial material such as epitaxial P type silicon (e.g., P, P+, P-silicon). The stripe trenches 30 may be filled using any suitable method including a selective epitaxial growth (SEG) process. For example, the trenches 30 may be filled with epitaxial silicon with doping occurring in-situ.

The material of the second conductivity type may completely fill the stripe trench 30 as shown in FIG. 8(d) or may line the stripe trench 35 as shown in FIG. 8(e). In FIG. 8(e), like numerals designate like elements as in FIG. 8(d). However, in this embodiment, the stripe 35 comprises a P-layer 35(a) and an inner dielectric material 35(b). The P-layer 35(a) may be deposited in the formed stripe trench first, and then the dielectric material 35(b) may be deposited to fill the enclosure formed by the P-layer 35(a). Alternatively, the inner dielectric material may be formed by oxidizing the P-layer 35(a). The dielectric material 35(b) may comprise a material such as silicon dioxide or air.

Other suitable methods which can be used to form doped epitaxial stripes of material in a trench are described in U.S. patent application Ser. No. 09/586,720 entitled "Method of Manufacturing A Trench MOSFET Using Selective Growth Epitaxy", by Gordon Madsen and Joelle Sharp. This application is assigned to the same assignee as the present invention and is incorporated by reference herein in its entirety for all purposes.

As noted, the stripe trench 30 and the stripes 35 of a second conductivity type are preferably formed after at least one of the source regions 36, the gate structures 45, and the well regions 34 are formed. By forming the stripes 35 after the formation of these device elements, the stripes 35 are not subjected to the high temperature processing used to form the gate structures 45 or the P–well regions 34. For example, the high temperature processing (e.g., ion implantation, high temperature drives) used to form the P–well regions can last as long as 1 to 3 hours at high temperatures (e.g., greater than 1100° C.). The formation of the P–stripes 35 in the semiconductor substrate 29, on the other hand, does not detrimentally affect previously formed gate structures 45, P–well regions 34, or the N+source regions 36. Forming these device elements before forming the P–stripes 35 reduces the likelihood that the P–stripes 35 in the epilayer will diffuse and lose their shape due to extended high temperature processing. If this occurs, the width of the P–stripes 35 may not be uniform down the P–stripe 35 and may decrease the effectiveness of the formed device. For example, dopant from a laterally enlarged P–stripe 35 could diffuse into the channel region of the MOSFET device thereby influencing the threshold voltage characteristics of the MOSFET device. Moreover, wider P–stripes can result in a larger gate structure 45 pitch, thus increasing the size of a corresponding array of gate structures 45.

After the P–stripes 35 are formed, additional layers of material may be deposited. Additional layers may include a metal contact layer 41 and a passivation layer (not shown). These additional layers may be formed by any suitable method known in the art.

Although a number of specific embodiments are shown and described, embodiments of the invention are not limited thereto. For example, embodiments of the invention have been described with reference to N type semiconductors, P–stripes, etc. It is understood that the invention is not limited thereto and that the doping polarities of the structures shown and described could be reversed. Also, although P–stripes are mentioned in detail, it is understood that the stripes used in embodiments of the invention may be P or N type. The stripes or other device elements may also have any suitable acceptor or donor concentration (e.g., +, ++, –, ––, etc.).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A field effect transistor device comprising:
   a semiconductor substrate of a first conductivity type having a major surface and a drain region;
   a well region of a second conductivity type formed in the semiconductor substrate;
   a source region of the first conductivity type formed in the well region;
   a trench gate electrode formed adjacent to the source region; and
   a stripe trench extending from the major surface of the semiconductor substrate into the semiconductor substrate to a predetermined depth, the stripe trench substantially completely filled with a semiconductor material of the second conductivity type to form a PN junction at an interface formed with the semiconductor substrate.

2. The field effect transistor device of claim 1 wherein the first conductivity type comprises N type and the second conductivity type comprises P type.

3. The field effect transistor device of claim 1 wherein the gate electrode comprises polysilicon.

4. The field effect transistor of claim 1 wherein the stripe trench extends from the major surface to an interface with the drain region.

5. The field effect transistor device of claim 1 wherein the device is a power MOSFET which has a breakdown voltage between about 100 and about 400 volts.

6. The field effect transistor device of claim 1 wherein the semiconductor substrate includes an epitaxial portion.

7. The field effect transistor device of claim 6 wherein the epitaxial portion has a thickness less than about 40 microns.

8. The field effect transistor device of claim 6 wherein the epitaxial portion includes a drift region.

9. The field effect transistor device of claim 6 wherein the epitaxial portion has a resistivity less than 14 ohm-cm.

10. The field effect transistor device of claim 1 wherein the drain region comprises an N+ semiconductor material.

11. The field effect transistor device of claim 1 wherein the stripe trench is completely filled with the semiconductor material of the second conductivity type.

12. The field effect transistor device of claim 1 wherein the semiconductor material of the second conductivity type is epitaxial P type silicon.

13. A field effect transistor device comprising:
   a semiconductor substrate of a first conductivity type having a major surface and a drain region;
   a well region of a second conductivity type formed in the semiconductor substrate;
   a source region of the first conductivity type formed in the well region;
   a trench gate electrode formed adjacent to the source region; and
   a stripe trench extending from the major surface of the semiconductor substrate into the semiconductor substrate to a predetermined depth, the stripe trench containing a semiconductor material of the second conductivity type to form a PN junction at an interface formed with the semiconductor substrate, wherein the stripe trench is lined with the semiconductor material of the second conductivity type and the remainder of the stripe trench is filled with a dielectric material.

14. The field effect transistor device of claim 13 wherein the first conductivity type is N type and the second conductivity type is P type.

15. The field effect transistor device of claim 13 wherein the dielectric material is silicon dioxide.

* * * * *